United States Patent
Park

(10) Patent No.: US 7,177,229 B2
(45) Date of Patent: Feb. 13, 2007

(54) APPARATUS FOR TUNING A RAS ACTIVE TIME IN A MEMORY DEVICE

(75) Inventor: Jung Hoon Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/941,804

(22) Filed: Sep. 15, 2004

(65) Prior Publication Data

US 2005/0057977 A1    Mar. 17, 2005

(30) Foreign Application Priority Data

Sep. 17, 2003 (KR) ...................... 10-2003-0064363

(51) Int. Cl.
*G11C 8/00* (2006.01)
*G11C 7/00* (2006.01)

(52) U.S. Cl. ...................... 365/233; 365/194

(58) Field of Classification Search ................ 365/233, 365/189.07, 189.08, 189.12, 194

See application file for complete search history.

(56) References Cited

U.S. PATENT DOCUMENTS 5,301,278 A * 4/1994 Bowater et al. ............ 365/233
5,751,655 A * 5/1998 Yamazaki et al. .......... 365/233
6,667,933 B2 * 12/2003 Tomita ...................... 365/233

* cited by examiner

Primary Examiner—Trong Phan
(74) Attorney, Agent, or Firm—Ladas & Parry LLP

(57) ABSTRACT

An apparatus can constantly tune the RAS active time by comparing the RAS active time generated in synchronization with a clock signal with the RAS active signal generated through an inverter delay circuit and adjusting a delay time by feeding back the result of comparison. The apparatus includes a clock sync time, an inverter delay time generating unit, a delay correcting unit, a comparing unit, and a delay control unit. The comparing unit compares signals outputted from the clock sync time generating unit and the delay correcting unit and outputs a signal corresponding to a result of comparison, and the delay control unit generates and provides a control signal corresponding to the output signal of the comparing unit to the delay correcting unit.

7 Claims, 6 Drawing Sheets

APPARATUS FOR TUNING A RAS ACTIVE TIME IN A MEMORY DEVICE

BACKGROUND OF THE INVENTION

1. Field of the Invention

The present invention relates to an apparatus for tuning an RAS (Row Address Strobe) active time in a memory device, and more particularly to an apparatus for tuning a RAS active time in a memory device which can constantly tune the RAS active time by comparing the RAS active time generated in synchronization with a clock signal with the RAS active signal generated through an inverter delay circuit and adjusting a delay time by feeding back the result of comparison.

2. Description of the Prior Art

As generally known in the art, a read operation of a semiconductor memory device is initiated by applying a row active command for activating memory cells, and in a conventional volatile memory device, the row active operation is performed by enabling a /RAS signal to be a low level.

If the /RAS signal is enabled to a low level (in the case of an SDRAM, if the corresponding command is applied), DRAM reads data stored in the memory cells, restores the same data as the read data in the memory cells, and then becomes pre-charged.

However, if the pre-charging is performed too fast, a problem may occur in the process of restoring the data in the memory cells. In order to prevent this, a RAS active time tRAS should be secured.

Generally, an inverter delay element is used to secure the RAS active time tRAS. However, the delay time of such an inverter delay element varies according to the temperature characteristic or voltage characteristic of the element. Accordingly, in the case of using the inverter delay element, the RAS active time tRAS is not fixed, but is changed.

Although a method for reflecting a result obtained from a specified test on an adjustment option for the inverter delay element may be proposed in order to solve the problem that the RAS active time tRAS is changed, it is difficult to set a proper RAS active time and the RAS active time is dependent on the characteristic of the element.

SUMMARY OF THE INVENTION

Accordingly, the present invention has been made to solve the above-mentioned problems occurring in the prior art, and an object of the present invention is to provide an apparatus for tuning a RAS active time in a memory device which has a constant RAS active time by comparing the RAS active time generated by a clock signal with the RAS active signal generated using an inverter delay and tuning a delay time according to the result of comparison.

In order to accomplish this object, there is provided an apparatus for tuning a RAS active time in a memory device for outputting a constantly tuned RAS active time, comprising a clock sync time generating unit for generating a first RAS active time in synchronization with a result of counting a predetermined number of clocks after a row active operation of the memory device, an inverter delay time generating unit for generating a second RAS active time using an inverter delay after the row active operation of the memory device, a delay correcting unit for correcting the second RAS active time outputted from the inverter delay time generating unit, a comparing unit for comparing signals outputted from the clock sync time generating unit and the delay correcting unit and outputting a signal corresponding to a result of comparison, and a delay control unit for generating and providing a control signal corresponding to the output signal of the comparing unit to the delay correcting unit.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
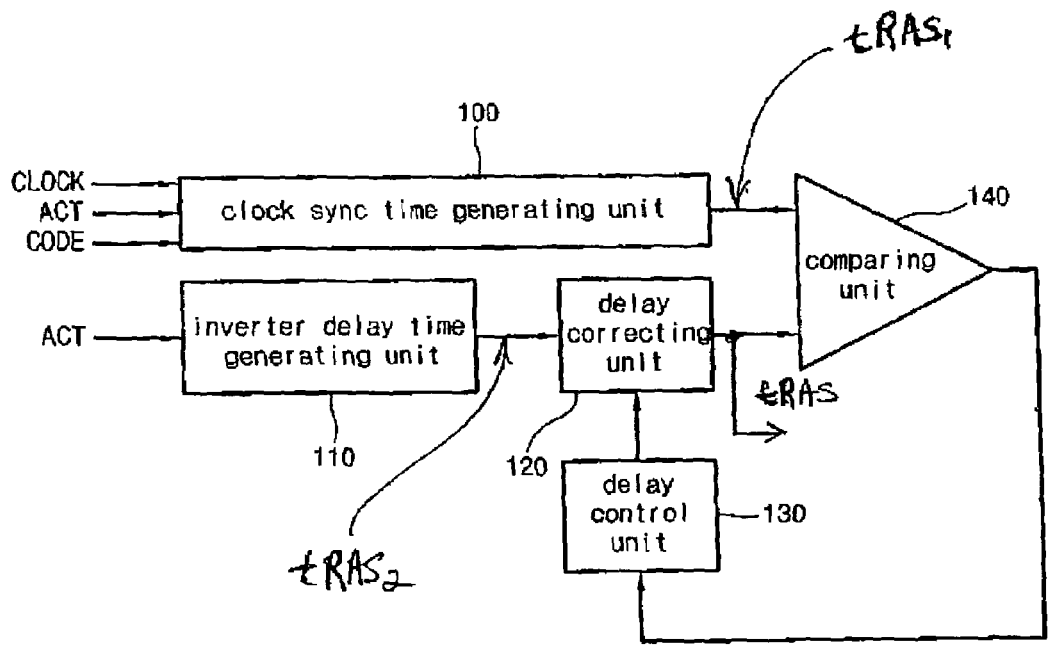
FIG. 1 is a block diagram illustrating the construction of an apparatus for tuning a RAS active time in a memory device according to a preferred embodiment of the present invention.

Hereinafter, a preferred embodiment of the present invention will be described with reference to the accompanying drawings. In the following description and drawings, the same reference numerals are used to designate the same or similar components, and so repetition of the description on the same or similar components will be omitted.

FIG. 1 is a block diagram illustrating the construction of an apparatus for tuning a RAS active time in a memory device according to a preferred embodiment of the present invention.

In the embodiment of the present invention, the RAS active time tuning operation is not performed in a normal operation mode of the memory device, but is performed in a test mode or a special mode set for the RAS active time tuning operation. This mode can be diversely set according to a manufacturer's intention.

Referring to FIG. 1, the term "CLOCK" denotes an external clock signal, and "ACT" a row active RAS signal. The term "CODE" denotes a signal for defining the number of clocks, and can be set using an address and so on.

For example, if the "CODE" signal is set as an address signal of 5 bits, it corresponds to the selection of one case among 32 cases. That is, if the address A<0:4> is given as "00111", it corresponds to "7" as a decimal number. This means that the RAS active time signal tRAS is generated to match the $7^{th}$ clock after a row active operation of the memory device.

The clock sync time generating unit 100 Is a circuit that receives the clock signal CLOCK and the row active signal ACT and generates an output signal that is the first RAS active time and which is identified in FIG. 1 as tRAS1, which will be in synchronization with the number of clocks defined by the "CODE" signal after the row active operation. The output signal tRAS1 will of course have a time when it is "active" and other times when it is off or "inactive."

The inverter delay time generating unit 110 is a circuit that receives the row active signal ACT at an input and which generates at an output port or terminal the tRAS2 output signal, the duration of which is referred to herein as the RAS active time tRAS2 by simply using an inverter delay after the row active operation. Since the duration of the tRAS2 signal is not in synchronization with the clock signal CLOCK, it is not constant and will vary according to the characteristic of an inverter element, voltage difference or temperature.

A delay correcting unit 120 is for correcting the duration of the second RAS active time tRAS2 output from the inverter delay time generating unit 110. The correction is performed by a control signal provided from a delay control unit 130.

A comparing unit 140 compares the duration of the tRAS1 signal of the clock sync time generating unit 100 to the duration of the second RAS active time of the tRAS2 signal input to the comparing unit 140 from the delay correcting unit 120 and provides an output signal to the delay control unit 130 corresponding to a result of comparison to the delay control unit 130.

The delay control unit 130 controls the time that is corrected by the delay correcting unit 120 according to the result of comparison provided from the comparing unit 140.

Specifically, the comparing unit 140 compares the RAS active time duration of tRAS1, which is synchronized with the clock, to the duration of the RAS active time tRAS2 generated by the inverter delay time generating unit 110.

If the duration of the RAS active time tRAS2 generated by the inverter delay time generating unit 110 is shorter than tRAS1 that synchronized with the clock as a result of comparison, the comparing unit 140 provides the result of the comparison as an output signal to the delay control unit 130. Then, the delay control unit 130 controls the delay correcting unit 120 to lengthen the delay time of the tRAS2 signal input to it.

In contrast, if the duration of the second RAS active time tRAS2 generated by the inverter delay time generating unit 110 is longer than the duration of the first RAS signal tRAS1, which is synchronized with the clock, the comparing unit 140 provides the result of the comparison to the delay control unit 130. Then, the delay control unit 130 controls the delay correcting unit 120 to shorten the delay time of tRAS2.

As the result of the comparison of the duration of tRAS2 to the duration of tRAS1 being repeatedly fed back to the comparing unit 140, the duration of the first RAS active time tRAS1 generated using the clock and the duration of the second RAS active time tRAS2 generated by the inverter delay time generating unit 110 become about the same duration.

Consequently, the delay value generated by the characteristic of the element is compensated for, and thus a constant RAS active time tRAS irrespective of the characteristic of the element can be obtained.

Figure 2:
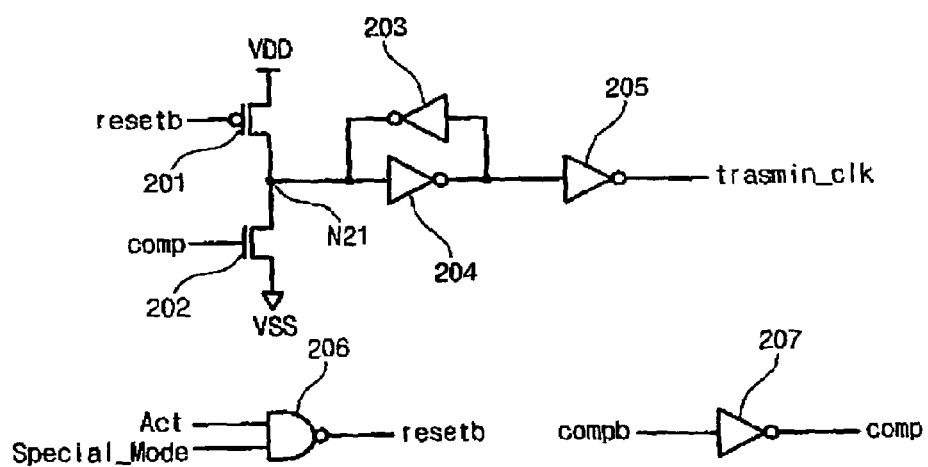
FIGS. 2, 3 and 4 are circuit diagrams illustrating examples of a clock sync time generating unit of FIG. 1.
Figure 3:
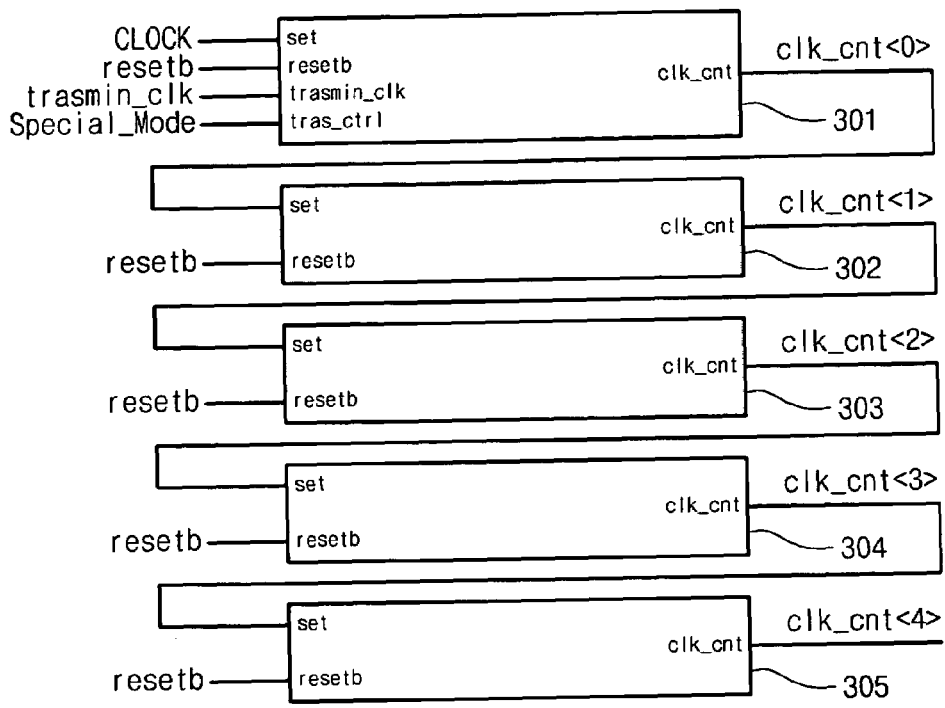
Figure 4:
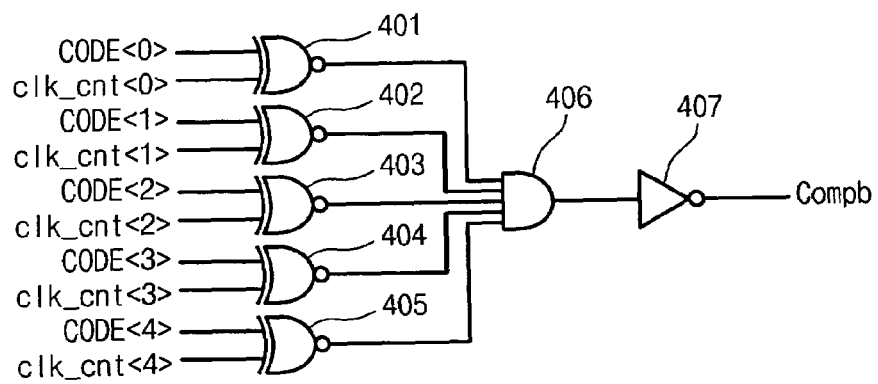

FIGS. 2, 3 and 4 are circuit diagrams illustrating examples of a clock sync time generating unit of FIG. 1.

In FIG. 2, an output circuit of the clock sync time generating unit is illustrated. The output circuit of FIG. 2 includes a PMOS transistor 201 connected to a power supply terminal and a common node N21, an NMOS transistor 202 connected between the common node N21 and ground, a latch composed of inverters 203 and 204 for inverting and storing an output signal of the common node N21, and an inverter 205 for receiving an output signal of the latch 203 and 204.

In FIG. 2, the PMOS transistor 201 is controlled by a control signal resetb applied to its gate, and the NMOS transistor 202 is controlled by a control signal comp applied to its gate.

An output signal trasmin_clk of the inverter 205 is applied to the comparing unit 140 as illustrated in FIG. 1.

In FIG. 2, a NAND gate 206 receives the row active signal ACT and a mode signal Special_Mode, and the output signal resetb of the NAND gate 206 is applied to the gate of the PMOS transistor 201. The inverter 207 receives the signal compb, and the output signal comp of the inverter 207 is applied to the gate of the NMOS transistor 202. A circuit for generating the signal applied to the inverter 207 will be explained later with reference to FIG. 4.

At an initial stage, if the special mode signal Special_Mode for operating the circuit of FIG. 1 is enabled and the row active signal ACT is enabled, the output signal resetb of the NAND gate 206 becomes low. Thus, the PMOS transistor 201 is turned on, and the output signal trasmin_clk of the output circuit of FIG. 2 becomes high. The high-level output signal trasmin_clk is applied to a counting unit 301 to be explained later with reference to FIG. 3.

FIG. 3 shows a counting circuit for generating count signals clk_cnt<0>, clk_cnt<1>, clk_cnt<2>, clk_cnt<3> and clk_cnt<4> used in the circuit of FIG. 4.

The counting circuit of FIG. 3 is provided with a plurality of counting units 301, 302, 303, 304 and 305.

The counting unit 301 outputs a clock signal clock, the output signal resetb of the NAND gate 206 as shown in FIG. 2, the output signal trasmin_clk as shown in FIG. 2 and the mode signal Special_Mode.

At an initial stage, if the signals applied to the counting unit 301 are all in a high level, the output signal clk_cnt<0> of the counting unit 301 goes from a standby state of a low level to a high level.

The counting unit 302 that keeps in an enable state while the output signal resetb of the NAND gate as shown in FIG. 2 keeps in a high level receives the output signal clk_cnt<0> of the counting unit 301. The output signal clk_cnt<1> of the counting unit 302 is toggled in synchronization with a rising edge of the input signal clk_cnt<0> of the counting unit 302.

The counting unit 303 that keeps in an enable state while the output signal resetb of the NAND gate as shown in FIG. 2 keeps in a high level receives the output signal clk_cnt<1> of the counting unit 302. The output signal clk_cnt<2> of the counting unit 303 is toggled in synchronization with a rising edge of the input signal clk_cnt<1> of the counting unit 303.

The counting unit 304 that receives the output signal clk_cnt<2> of the counting unit 303 and the counting unit 305 that receives the output signal clk_cnt<3> of the counting unit 304 have the same construction and operation as the counting units 302 and 303, respectively. Accordingly, the output signal clk_cnt<3> of the counting unit 304 is toggled in synchronization with a rising edge of the input signal clk_cnt<2> of the counting unit 304, and the output signal clk_cnt<4> of the counting unit 305 is toggled in synchronization with a rising edge of the input signal clk_cnt<3> of the counting unit 305.

FIG. 4 shows the comparing unit for comparing the "CODE" signals Code<0:4> and the count signals clk_cnt<0:4>. The output signal Compb of the comparing unit is applied to the inverter 207.

The comparing unit of FIG. 4 compares the "CODE" signal and the count signal. If both signals coincide with each other, the output signal Compb of the comparing unit becomes low.

In FIG. 4, an XOR gate 401 receives signals Code<0> and clk_cnt<0>, an XOR gate 402 receives signals Code<1> and clk_cnt<1> and an XOR gate 403 receives signals Code<2> and clk_cnt<2>. An XOR gate 404 receives signals Code<3> and clk_cnt<3> and an XOR gate 405 receives signals Code<4> and clk_cnt<4>.

Output terminals of the XOR gates 401 to 405 are connected to input terminals of an AND gate 406. The output signal Compb of the inverter 407 is used as and input signal of the inverter 207 of FIG. 2.

The operation of the comparing unit of FIG. 4 is as follows.

For example, if the "CODE" signal is "00111", Code<5> is "0", Code<4> "0", Code<3> "0", Code<2> "1", Code<1> "1" and Code<0> "1". Accordingly, if the output signal of the counting circuit of FIG. 3 is "00111", the "CODE" signal and the count signal coincide with each other. In this case, the output signal Compb of the comparing unit of FIG. 4 becomes low. As a result, the NMOS transistor of FIG. 2 is turned on and the output signal trasmin_clk of the circuit of FIG. 2 becomes low.

If the output signal trasmin_clk of the circuit of FIG. 2 becomes low, the counting circuit of FIG. 3 is reset.

Figure 5:
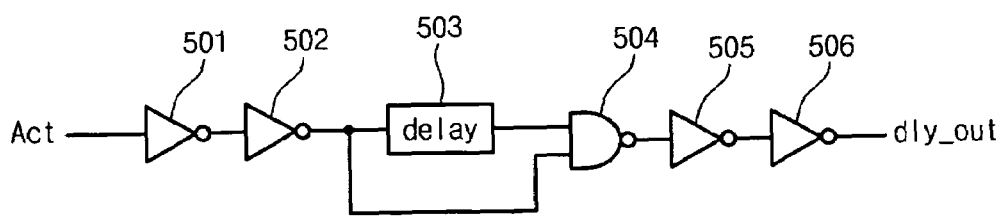
FIG. 5 is a circuit diagram illustrating an example of an inverter delay time generating unit of FIG. 1.

FIG. 5 is a circuit diagram illustrating an example of an inverter delay time generating unit of FIG. 1.

The inverter delay time generating unit 110 of FIG. 5 includes buffer units 501 and 602 for receiving and delaying the row active signal ACT for a predetermined time, a delay unit 503 for delaying an output signal of the buffer unit 501 and 502 for a predetermined time, and logic circuit unit 507, which is comprised of logic gates 504, 505 and 506, for receiving the output signal of the delay unit 503 and outputting a specified pulse signal dly_out. The duration of the second RAS active time is determined by the timing of the output signal dly_out of the circuit unit.

The buffer units 501 and 502 are respectively an inverter 501 for receiving the ACT signal and an inverter 502 for receiving an output signal of the Inverter 501. The delay unit 503 receives and delays an output signal of the inverter 502 for a predetermined time. The circuit unit 507 includes a NAND gate 504 and inverters 505 and 506. The NAND sate 504 receives the output signal of the delay unit 503 end the output signal of the inverter 502. The inverter 505 receives an output signal of the NAND gate 504. The inverter 506 receives an output signal of the inverter 505.

In FIG. 5, the delay unit 503 is composed of an inverter chain, and an output signal of the inverter 506 is used as an input signal of the delay correcting unit to be explained later with reference to FIG. 8.

Figure 6:
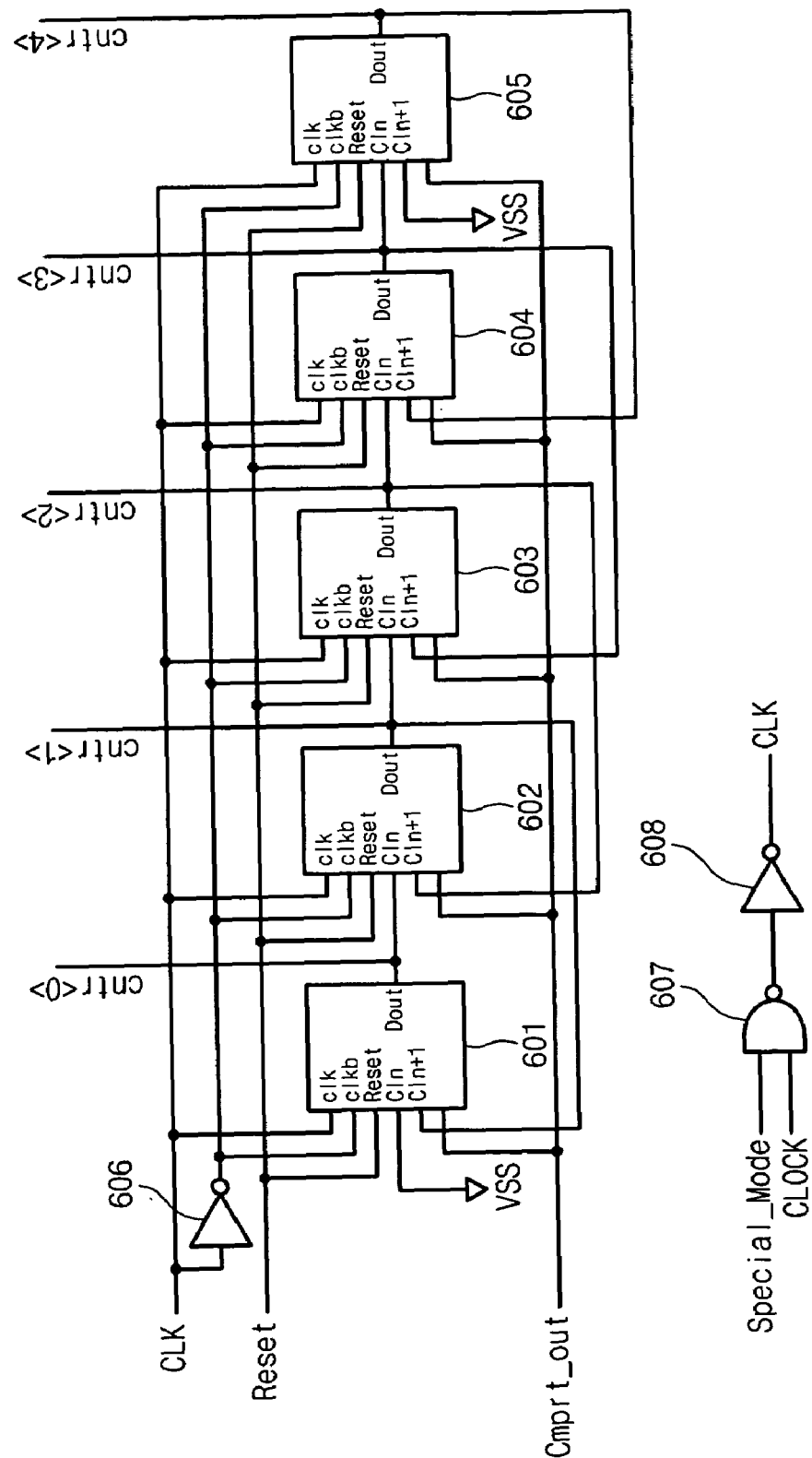
FIGS. 6 and 7 are circuit diagrams illustrating examples of a delay control unit of FIG. 1.
Figure 7:
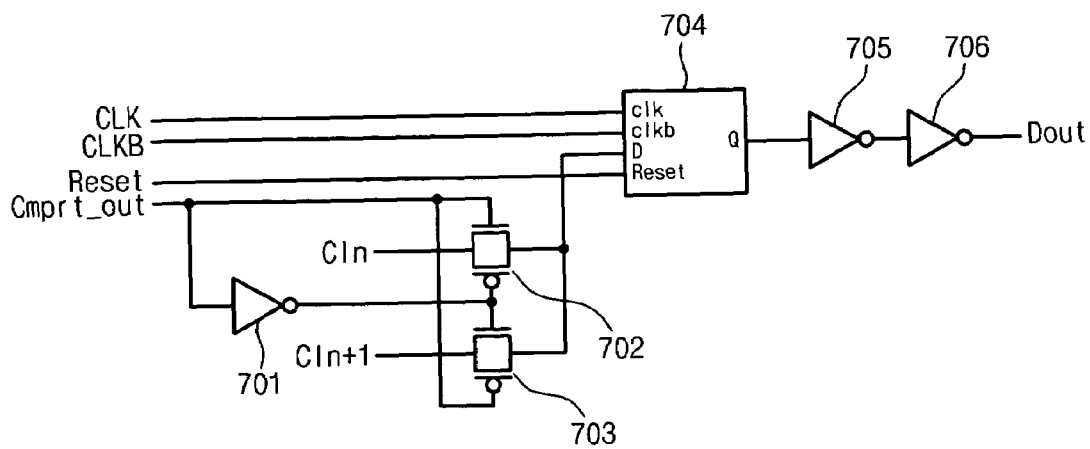

FIGS. 6 and 7 are circuit diagrams illustrating examples of a delay control unit of FIG. 1.

In FIG. 6, the delay control unit is provided with a plurality of shift registers 601 to 605. Also, a NAND gate 607 receives the mode signal Special_Mode and the clock signal CLOCK and an output signal of the NAND gate 607 is applied to an inverter 608. An output signal CLK of the inverter 608 is applied to the respective shift registers 601 to 605. The clock signal CLK is applied to an inverter 606, and an output signal of the inverter 606 is denoted as CLKB.

Input signals applied to the respective shift registers are the clock signals CLK and CLKB, a reset signal Reset and the output signal of the comparing unit 140 as shown in FIG. 1. As will be explained later with reference to FIG. 9, the output signal of the comparing unit 140 is denoted as Cmprt_out.

Figure 8:
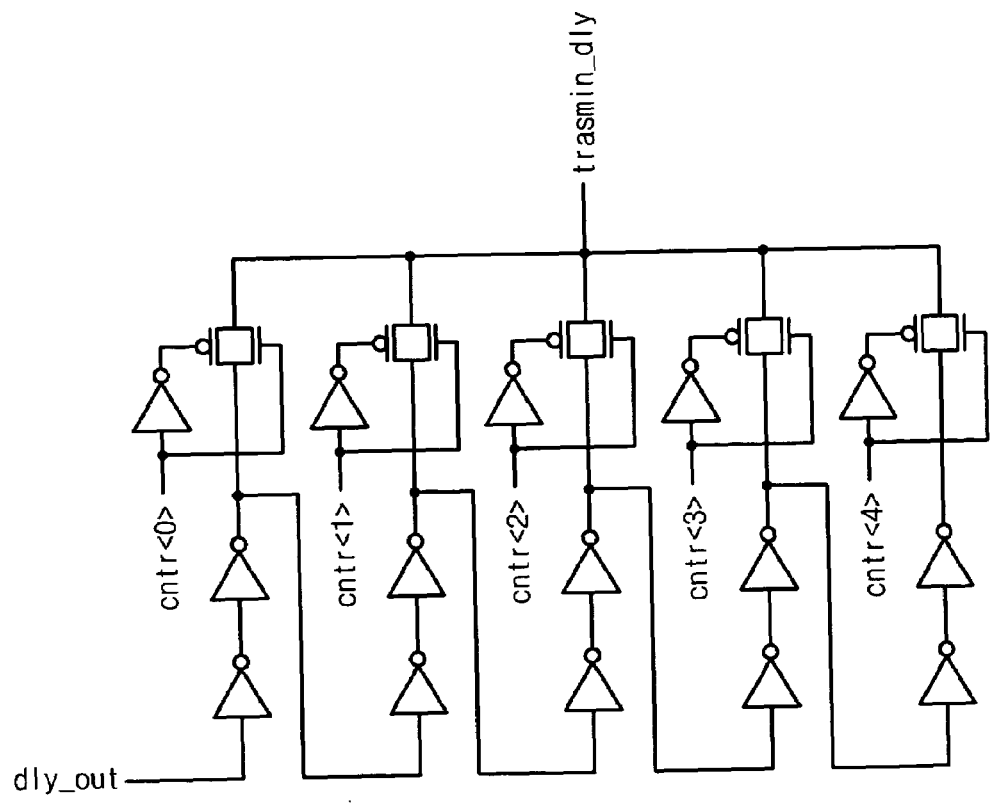
FIG. 8 is a circuit diagram illustrating an example of a delay correcting unit of FIG. 1.

The delay time of the delay correcting unit of FIG. 8 is determined according to the output signals cntr<0:4> of the shift registers.

In FIG. 6, the initial values of the shift registers constituting the delay control unit are determined as follows.

The output value cntr<0> of the shift register 601 is set to "low", the output value cntr<1> of the shift register 602 "low", the output value cntr<2> of the shift register 603 "high", the output value cntr<3> of the shift register 604 "low" and the output value cntr<4> of the shift register 605 "low", respectively.

FIG. 7 shows an example of the shift register as illustrated in FIG. 6.

Figure 9:
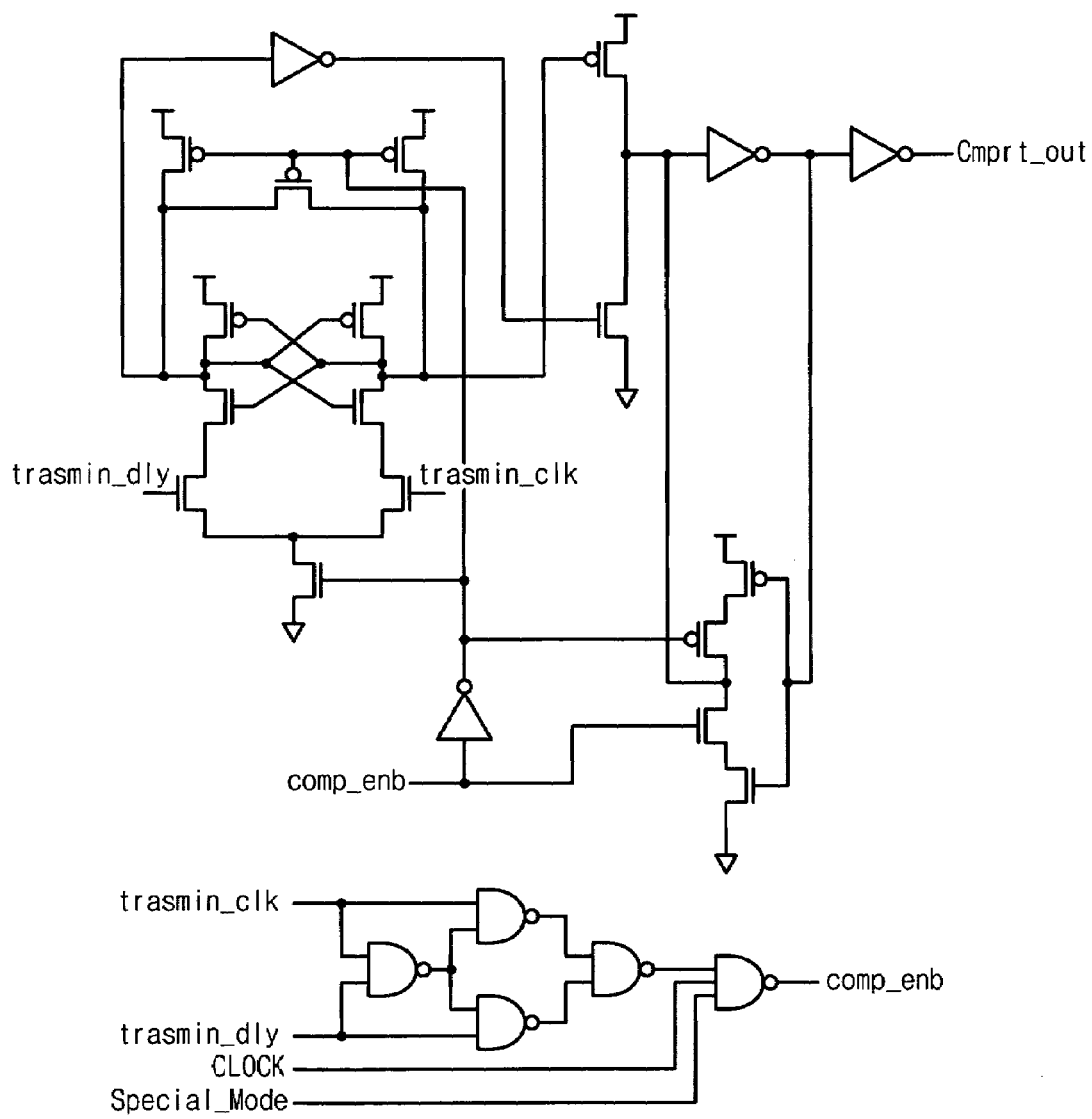
FIG. 9 is a circuit diagram illustrating an example of a comparing unit of FIG. 1.

The shift register includes an inverter 701 for receiving the output signal Cmprt_out of the comparing unit of FIG. 9, switching elements 702 and 703, a D-type flip-flop 704, an inverter 705 for receiving an output signal of the D-type flip-flop 704 and an inverter 706 for receiving an output signal of the inverter 705.

In FIG. 7, "CIn" denotes an output signal of a preceding shift register and "CIn+1" denotes an output signal of a following shift register.

If the output signal Cmprt_out of the comparing unit of FIG. 9 is in a high level, the switching element 702 is turned on, and the signal CIn is applied to the D-type flip-flop 704 as its input. By contrast, if the output signal Cmprt_out of the comparing unit of FIG. 9 is in a low level, the switching element 703 is turned on, and the signal CIn+1 is applied to the D-type flip-flop 704 as its input.

The signal applied to the D-type flip-flop 704 is outputted from an output terminal Q of the D-type flip-flop in synchronization with the rising edge of the clock signal CLK. The output signal of the D-type flip-flop 704 is applied to the inverter 705, and the output signal of the inverter 705 is applied to the inverter 706. The output signal Dout of the inverter 706 indicates the output signals cntr<0:4> of the respective shift registers as shown in FIG. 6.

FIG. 8 shows an example of the delay correcting unit 120 as shown in FIG. 1.

In FIG. 8, the signal dly_out is the output signal of the delay time generating unit as shown in FIG. 5.

As shown in FIG. 8, if one of the output signals of the shift registers as shown in FIGS. 6 and 7 is enabled to a high level, the input signal dly_out is outputted after being delayed for a predetermined time. As shown in FIG. 6, at the initial stage, only the signal cntr<2> is in a high level, and the remaining signals cntr<0>, cntr<1>, cntr<3> and cntr<4> are in a low level.

The output signal trasmin_dly of the delay correcting unit is used as one of the input signals of the comparing unit 140.

FIG. 9 show an example of the comparing unit of FIG. 1.

The comparing unit of FIG. 9 compares the output signal trasmin_out of the clock sync time generating unit of FIG. 2 with the output signal trasmin_dly of the delay correcting unit of FIG. 8.

In FIG. 9, the signal Comp_enb is an enable signal, and a circuit for generating the enable signal Comp_enb is shown in FIG. 9.

Figure 10:
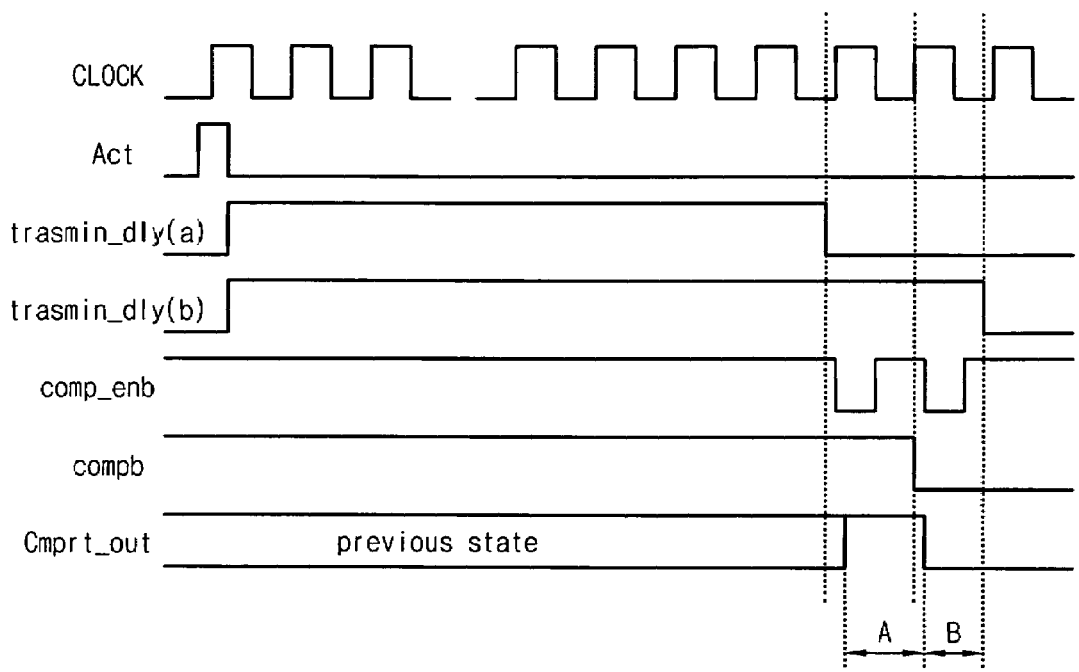
FIG. 10 is a waveform diagram explaining the operation of the apparatus according to the present invention.

FIG. 10 is a waveform diagram explaining the operation of the apparatus explained with reference to FIGS. 2 to 9 according to the present invention.

In FIG. 10, the signal trasmin_dly(a) corresponds to the case that the output signal trasmin_dly of the delay correcting unit of FIG. 7 is shorter than the output signal trasmin_clk of the clock sync time generating unit of FIG. 2. In this case, the output signal Cmprt_out of the comparing unit outputs a high level for a time period A. Accordingly, as shown in FIG. 6, the output value of the shift register 603 initially set to a high level is transferred to the shift register 604. As a result, the delay time in the delay correcting unit of FIG. 8 is lengthened.

In FIG. 10, the signal trasmin_dly(b) corresponds to the case that the output signal trasmin_dly of the delay correcting unit of FIG. 7 is longer than the output signal trasmin_clk of the clock sync time generating unit of FIG. 2. In this case, the output signal Cmprt_out of the comparing unit outputs a low level for a time period B. Accordingly, as shown in FIG. 6, the output value of the shift register 603 initially set to a high level is transferred to the shift register 602. As a result, the delay time in the delay correcting unit of FIG. 8 is shortened.

From the foregoing, it will be apparent that the apparatus for tuning a RAS active time in a memory device according to the present invention has a constant RAS active time by comparing the RAS active time generated by a clock signal with the RAS active signal generated using an inverter delay and tuning a delay time according to the result of comparison.

Accordingly, a constant RAS active time is obtained irrespective of the characteristic of a delay element and unnecessary tests for a physical option setting is removed, so that the RAS active time is easily set and the reliability of the element is improved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An apparatus for adjusting a RAS active time in a memory device for outputting a constantly tuned RAS active time, comprising:
   a clock sync time generating unit that generates a first RAS signal tRAS1 in synchronization with a result of counting a predetermined number of clocks after a row active operation of a memory device;
   an inverter delay time generating unit that generates a second RAS signal tRAS2 using an inverter delay after the row active operation of a memory device;
   a delay correcting unit that corrects the duration of the second RAS signal tRAS2 output from the inverter delay time generating unit;
   a comparing unit that compares signals output from the dock sync time generating unit and the delay correcting unit and which outputs a signal corresponding to a result of the comparison; and
   a delay control unit that generates and provides a control signal corresponding to the output signal of the comparing unit to the delay correcting unit.

2. The apparatus as claimed in claim 1, wherein the clock sync time generating unit operates in a special mode for performing the tuning operation to generate the first RAS signal tRAS1.

3. The apparatus as claimed in claim 2, wherein the special mode is set by a row active signal.

4. The apparatus as claimed in claim 1, wherein if the duration of the second RAS signal tRAS2 after having passed through the delay correction unit is shorter than the duration of the first RAS signal tRAS1, the delay control unit increases a delay time of the delay correction unit; and if the duration of the second RAS signal tRAS2 having passed through the delay correction unit is longer than the duration of the first RAS signal tRAS1, the delay control unit decreases the delay time of the delay correction unit.

5. The apparatus as claimed in claim 1, wherein the dock applied to the clock sync time generating unit is an external clock applied to the memory device.

6. The apparatus as claimed in claim 5, wherein the clock sync time generating unit includes a plurality of shift registers connected in series; the external clock is applied to the first shift register among the plurality of shift registers; and the first RAS active time is determined by an output signal of the last shift register among the plurality of shift registers.

7. The apparatus as claimed in claim 1, wherein the inverter delay time generating unit comprises: a buffer unit for receiving and delaying a row active signal for a predetermined time; a delay unit for delaying an output signal of the buffer unit for a predetermined time; and a circuit unit for receiving the output signal of the buffer unit and an output signal of the delay unit and outputting a specified pulse signal; wherein the duration of the second RAS signal tRAS2 is determined by a timing of the output signal of the circuit unit.

* * * * *